United States Patent [19]

Dinger

[11] Patent Number: 4,824,303

[45] Date of Patent: Apr. 25, 1989

[54] LOCKING WEDGE APPARATUS FOR PRINTED CIRCUIT BOARD

[75] Inventor: William A. Dinger, Oakland, N.J.

[73] Assignee: Rexnord Inc., Torrance, Calif.

[21] Appl. No.: 100,464

[22] Filed: Sep. 24, 1987

[51] Int. Cl.[4] .............................................. F16B 2/14
[52] U.S. Cl. ..................................... 411/79; 254/104;
    403/297; 403/358; 403/374; 411/80; 411/428
[58] Field of Search ...................... 411/80, 79, 55, 75,
    411/428, 903, 908, 914; 403/297, 374, 358,
    409.1; 254/42, 104

[56] References Cited

U.S. PATENT DOCUMENTS

| 1,138,368 | 5/1915 | Feeley | 403/374 X |
| 1,217,539 | 2/1917 | Underwood | 254/42 |
| 2,051,251 | 8/1936 | Epstein | 411/79 X |
| 2,999,706 | 9/1961 | Wilcox | 403/409.1 X |
| 3,399,589 | 9/1968 | Breed | 411/428 |
| 3,678,342 | 7/1972 | Shaw | 361/386 |
| 3,767,058 | 10/1973 | Barlow et al. | 211/41 |
| 3,865,095 | 2/1975 | Helmick | 403/374 X |
| 3,971,186 | 7/1976 | Havelka et al. | 403/374 |
| 4,206,060 | 6/1980 | Yamamoto et al. | 411/428 X |
| 4,318,157 | 3/1982 | Rank et al. | 361/386 |
| 4,354,770 | 10/1982 | Block | 403/409.1 |
| 4,414,605 | 11/1983 | Chino et al. | 361/388 |
| 4,480,287 | 10/1984 | Jensen | 361/388 |

FOREIGN PATENT DOCUMENTS

| 93887 | 9/1897 | Fed. Rep. of Germany | 411/80 |
| 347632 | 8/1960 | Switzerland | 411/80 |
| 647078 | 12/1950 | United Kingdom . | |
| 2111758 | 7/1983 | United Kingdom . | |
| 2166004 | 4/1986 | United Kingdom . | |

OTHER PUBLICATIONS

Calmark Corporation Parts Catalog, page 16, "Series V-Visual Lock Indicator for 'Card-Lok' retainer."
Marstein, Howard W., "Packaging Hardware Evolves With Advancing Technology," *Electronic Packaging and Production*, Nov., 1983.
"Ejection Mechanism for Circuit Boards", NASA Tech Briefs, Mar./Apr. 1986.

Primary Examiner—Lloyd A. Gall
Attorney, Agent, or Firm—Pretty, Schroeder, Brueggemann & Clark

[57] ABSTRACT

A locking wedge apparatus for fastening a printed circuit board within an elongated slot in a rack. The apparatus includes an elongated center wedge having sloped surfaces at its opposite ends and two end wedges abutting against the center wedge's opposite sloped surfaces. A screw interconnects the two end wedges, threadedly engaging a threaded bore in the remote end wedge. A friction nut is positioned on a portion of the screw's remote end that projects beyond the remote end wedge, and the apparatus is configured to include a pair of low-friction, abutting surfaces between the nut and the remote end wedge. This ensures that when the screw is fully loosened, the frictional torque applied to the nut by the end wedge is exceeded by the frictional torque applied to the nut by the screw. Further unthreading of the screw is thereby effectively inhibited.

9 Claims, 1 Drawing Sheet

U.S. Patent  Apr. 25, 1989  4,824,303
FIG. 1
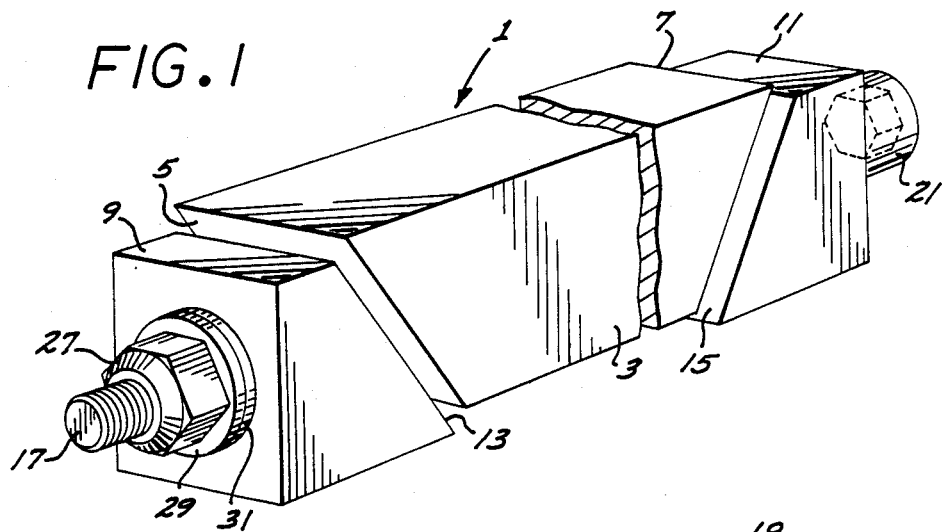
FIG. 2
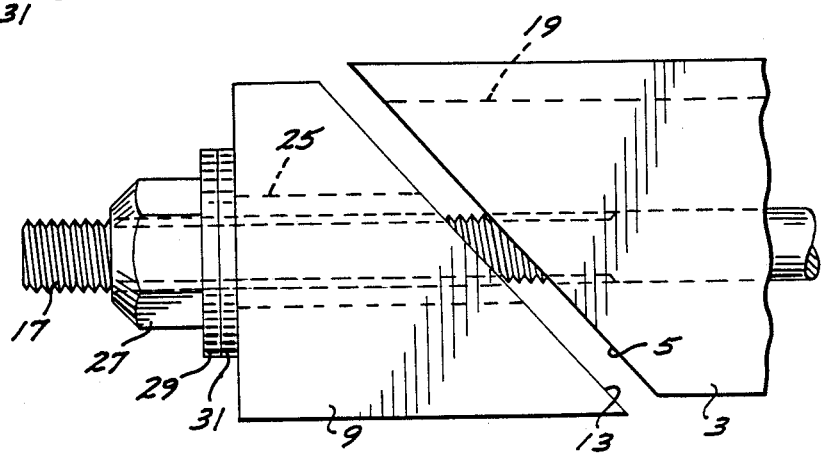
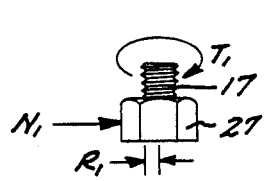
FIG. 3
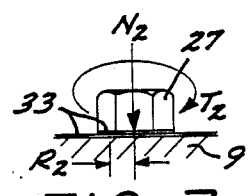
FIG. 7
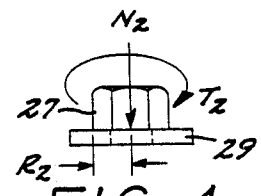
FIG. 4
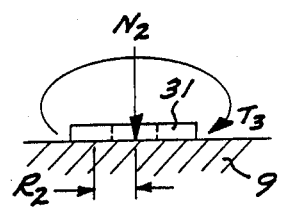
FIG. 5
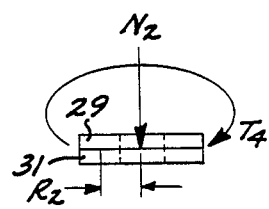
FIG. 6

LOCKING WEDGE APPARATUS FOR PRINTED CIRCUIT BOARD

BACKGROUND OF THE INVENTION

This invention relates generally to apparatus for mounting and fastening printed circuit boards or cards within a rack or chassis, and, more particularly, to apparatus of the kind that includes an elongated wedge assembly that expands transversely to fasten the board in place.

Elongated wedge assemblies of this particular kind have been in common use for fastening printed circuit (i.e., PC) boards within an elongted slot in a rack or chassis. The assembly typically includes a center wedge having sloped surfaces at its opposite ends and two end wedges having sloped surfaces that abut against the center wedge's sloped surfaces. A screw extends lengthwise through the center wedge and connects together the two end wedges. The end wedge remote from the head of the screw has a threaded bore engaged by the screw such that a clockwise rotation of the screw draws the two end wedges toward each other, causing them to deflect transversely on the sloped abutting surfaces. This increases the assembly's effective width and thereby fastens the PC board tightly within the slot. Subsequently rotating the screw in a counterclockwise direction moves the two end wedges apart from each other, to bring them back into longitudinal alignment with the center wedge and, thereby, to release the clamping force on the PC board.

It is desirable to provide a means for the remote end wedge when the wedge assembly is loosened. Excessive unthreading can allow one or both of the end wedges to rotate relative to center wedge and thereby prevent an insertion of the assembly into the chassis slot. It also can allow the remote end wedge to become fully disengaged from the assembly.

One technique for preventing an excessive unthreading of the screw is to insert a locking pin through a hole drilled diametrically through the screw's remote end. With the pin in place, the screw can be unthreaded only to the point where the pin first engages the remote end wedge. This technique, though effective, is not entirely satisfactory. It is generally quite difficult to drill a hole diametrically through a screw, particularly if the screw has a small diameter. Also, it is necessary to remove any resulting drill burr on the thread so that the remote wedge can be threaded onto the screw.

Another technique attempted in the past for preventing the screw from being inadvertently unthreaded from the remote end wedge when the assembly is loosened is to thread a friction nut onto the screw's remote end. When the assembly is being tightened, the friction nut simply rotates along with the screw and remains spaced from the end wedge. When the assembly is being loosened, the nut again rotates along with the screw, until the screw unthreads to the point where the nut contacts the end wedge. When that point is reached, the hope is that the nut will bear against the end wedge and prevent further unthreading. However, if the frictional torque of the nut bearing against the wedge exceeds the frictional torque of the nut threads bearing against the screw threads, as is usually the case, then the screw can continue to unthread. This has occurred in the past even where a washer or spacer has been interposed between the nut and the remote end wedge.

It should, therefore, be appreciated that there is a need for a locking wedge assembly that is configured to effectively prevent an excessive unthreading of the screw from the remote end wedge when the assembly is loosened and that is inexpensive and convenient to manufacture and assemble. The present invention fulfills this need.

SUMMARY OF THE INVENTION

The present invention is embodied in a locking wedge apparatus for fastening PC boards within an elongated slot, the apparatus including means for effectively preventing an inadvertent disassembly of the apparatus when it is loosened. The locking wedge apparatus includes an elongated center wedge having sloped surfaces at its opposite ends and two end wedges located at opposite ends of the center wedge and having surfaces that abut against the sloped surfaces of the center wedge. A screw extends through a channel formed in the center wedge, to interconnect the two end wedges. The screw threadedly engages a threaded bore in the end wedge furthest from the screw's head, and the screw's remote end projects a short distance beyond that end wedge. Rotation of the screw in a first direction draws the two end wedges toward each other such that the end wedges and interconnecting screw are deflected transversely by the sloped surfaces of the center wedge. This locks the printed circuit board within the elongated slot.

In accordance with the invention, to prevent an excessive unthreading of the screw from the remote end wedge when the apparatus is being loosened, a friction nut is threaded onto the screw's remote end and the apparatus is configured to include a pair of low-friction, abutting surfaces between the nut and the remote end wedge. This ensures that when the screw is loosened to the point where the friction nut compressively engages the remote end wedge, the frictional torque applied to the nut by its compressive engagement with the end wedge is exceeded by the frictional torque applied to the nut by the screw. Further unthreading of the screw is thereby effectively inhibited.

In one embodiment of the invention, the low-friction, abutting surfaces are provided by a pair of flat, low-friction spacers positioned around the screw, between the nut and the remote end wedge. The spacers can be made of a low-friction plastic material such as polypropylene. In an alternative embodiment of the invention, the low-friction, abutting surfaces are provided by an appropriate low-friction coating on the nut and end wedge. This coating, likewise, can be of a low-friction plastic material such as polypropylene. Both embodiments are inexpensive and convenient to assemble and use, yet completely effective in preventing an inadvertent disassembly of the apparatus.

Other aspects and advantages of the present invention will become apparent from the following description of the preferred embodiment, taken in conjunction with the accompanying drawings, which illustrate, by way of example, the principles of the invention.

BRIEF DESCRIPTION OF THE DRAWINGS

FIG. 1 is a perspective view of a locking wedge assembly in accordance with the present invention.

FIG. 2 is an elevational view of a portion of the locking wedge assembly of FIG. 1, showing the friction nut and low-friction spacers.

FIG. 3-7 are a series of schematic views of the friction nut, spacers, screw and remote end wedge portion of the assembly, which are useful in describing analytically how the friction nut and spacers prevent an inadvertent unthreading of the screw from the remote end wedge.

DESCRIPTION OF THE PREFERRED EMBODIMENTS

With reference now to the illustrative drawings, and particularly to FIGS. 1 and 2, there is shown one embodiment of a locking wedge assembly generally indicated by the reference numeral 1, for use in retaining a printed circuit (i.e., PC) board in an elongated slot formed in a chassis or a rack, none of which is shown in the drawings. The slot is of substantially greater width than the thickness of the PC board, so as to receive both an edge of the board and the locking wedge assembly. The assembly includes an elongated center wedge 3, which can be fixed by screws or rivets (not shown) to the edge of the PC board. The center wedge 3 includes sloped surfaces 5 and 7 at its opposite ends. Cooperating first and second end wedges 9 and 11 include sloped surfaces 1 and 15, respectively, that abut against the sloped surfaces 5 and 7 of the center wedge, and a screw 17 extends through an elongated channel 19 (shown in phantom) in the center wedge to interconnect the two end wedges. The screw head 21 bears against the second end wedge 11 and the opposite end of the screw first end wedge 9. The screw's remote end projects a short distance beyond the first end wedge.

Rotating the screw 17 in one direction (e.g., clockwise) draws the two end wedges 9 and 11 toward each other, causing the end wedges and the screw to deflect transversely relative to the center wedge 3. This increases the assembly's effective transverse width and, thus, locks the PC board within the slot. Conversely, rotating the screw in the opposite direction moves the two end wedges apart from each other, to loosen the assembly and permit removal of the PC board from the slot.

In accordance with the invention, the assembly further includes a friction nut 27 threaded onto the remote end of the screw 17 and two low-friction washers or spacers 29 and 31 encircling the screw, between the nut and the first end wedge 9. The nut and spacers function effectively to prevent an inadvertent disassembly of the first end wedge by excessively unthreading the screw. During tightening of the assembly, the nut turns along with the screw and the spacers remain loosely confined between the nut and the first end wedge. During loosening of the assembly, the nut again turns along with the screw and the spacers remain loosely confined, until the screw has been unthreaded to the point where the nut begins squeezing the spacers against the end wedge. For reasons explained in detail below, further turning of the screw is effectively prevented.

In previous locking wedge assemblies of the kind including a friction nut and either no spacer or just a single spacer between the nut and remote end wedge, the frictional torque applied to the nut by its compressive engagement with the remote end wedge normally exceeded the frictional torque applied to the nut by the unthreading screw. Such a situation enabled the screw to continue unthreading, with the nut remaining fixed against the remote end wedge, as though a mere extension of the wedge.

In the assembly of the invention, on the other hand, the two spacers 29 and 31 effectively prevent the application of a substantial frictional torque to the nut 27 from its compressive engagement with the remote end wedge 9. The two spacers are preferably formed of a plastic material such as polypropylene, and the abutting surfaces of the spacers are smooth and flat so as to have a very low coefficient of friction. The frictional torque they develop, therefore, is insufficient to overcome the frictional torque developed between the screw 17 and the nut. There screw, therefore, cannot be unthreaded from the nut, and the nut effectively prevents an excessive unthreading of the screw from the remote end wedge.

FIGS. 3-6 below depict the forces acting on the nut 27 and, along with the analysis presented below, are useful in understanding how the two spacers 29 and 31 ensure that the nut will prevent an excessive unthreading of the screw 17 from the remote end wedge 9. The following terms are used in the analysis:

$T_1$ = Frictional torque between the friction nut 27 and the screw 17.

$T_2$ = Frictional torque between the nut 27 and the first low-friction spacer 29.

$T_3$ = Frictional torque between the first end wedge 9 and the second low-friction spacer 31.

$T_4$ = Frictional torque between the two low-friction spacers 29 and 31.

$f_1$ = Coefficient of friction between the nut 27 and the screw 17.

$f_2$ = Coefficient of friction between the nut 27 and the first low-friction spacer 29.

$f_3$ = Coefficient of friction between the first end wedge 9 and the second low-friction spacer 31.

$f_4$ = Coefficient of friction between the two low-friction spacers 29 and 31.

$R_1$ = Acting radius of frictional force between the screw 17 and the nut 27.

$R_2$ = Acting radius of frictional forces between the nut 27, low-friction spacers 29 and 31, and first end wedge 9.

$N_1$ = Normal force applied to the threads of the screw 17 by the threads of the nut 27.

$N_2$ = Normal forces applied to the nut 27, the first end wedge 9, and the two low-friction spacers 29 and 31 by the rotating screw 17.

Since frictional torque T is equal to the radius R multiplied by the normal force N multiplied by the coefficient of friction f, the following relationships exist:

$T_1 = R_1 N_1 f_1$
$T_2 = R_2 N_2 f_2$
$T_3 = R_2 N_2 f_3$
$T_4 = R_2 N_2 f_4$

For the nut 27 to be effective in preventing the screw 17 from being inadvertently unthreaded from the first end wedge 9, at least one of $T_2$, $T_3$ and $T_4$ must be less than $T_1$. Otherwise, the nut and spacers 29 and 31 will compressively bear against the end wedge and be held firmly in place, while the screw continues to unthread.

The only difference between the equations for $T_2$, $T_3$ and $T_4$ lies in the frictional coefficients $f_2$, $f_3$ and $f_4$. The normal force $N_2$ and the radius $R_2$ at which that force is applied are the same in each equation. The lowest of these three frictional coefficients is, of course, $f_4$, which is the coefficient for the abutting surfaces of the two low-friction spacers 29 and 31. The other two frictional coefficients, $f_2$ and $f_3$, are greater because each is based on the abutment of two dissimilar materials. In the case of $f_2$, it is the nut 27 bearing against the first low-friction spacer 29, and in the case of $f_3$, it is the second low-friction spacer 31 bearing against the first end wedge 9.

For $T_4$ to be less than $T_1$, the following inequality must occur:

$$R_2 N_2 f_4 < R_1 N_1 f_1$$

or $$f_4 < (R_1/R_2)(N_1/N_2) f_1$$

$R_1$ is necessarily somewhat less than $R_2$, and $N_1$ is necessarily somewhat less than $N_2$, which is dependent on the pitch of the threads of the screw 17. Consequently, $f_4$ must be less than $f_1$ by at least the product of the radii ratio and the normal force ratio, for this inequality to apply. Increasing $f_1$ or $N^1$ is not desirable, because that could make it difficult to thread the nut onto the screw. The easiest solution is to design $f_4$ to be as low as possible, which can be accomplished by forming the two low-friction spacers 29 and 31 of a low-friction plastic material such as polypropylene, as described above.

In an alternative embodiment of the invention (FIG. 7), the two low-friction spacers 29 and 31 are eliminated and replaced by a low-friction coating 33 on the facing surfaces of the friction nut 27 and the remote end wedge 9. The coating is selected to provide a frictional coefficient, $f_5$, for the facing surfaces sufficiently low that the same inequality set forth above is applicable. Specifically, $$f_5 < (R_1/R_2)(N_1/N_2) f_1$$

Coating the nut and the end wedge with a low-friction plastic material such as polypropylene is effective.

It should be appreciated from the foregoing description that the present invention provides an improved locking wedge assembly for locking PC boards into a slot formed in a rack. A friction nut is positioned on the remote end of a screw that interconnects three cooperating wedges, and at least two facing surfaces between the nut and the remote end wedge are configured to have a low frictional coefficient. This effectively prevents an excessive unthreading of the screw from the remote wedge Although the present invention has been described in detail with reference only to the presently preferred embodiments, it will be appreciated by those of ordinary skill in the art that various modifications can be made without departing from the invention. Accordingly, the invention is defined only by the following claims.

I claim:

1. A locking wedge apparatus for locking a printed circuit board within an elongated slot in a rack, comprising:
    a center wedge having sloped surfaces at its opposite ends;
    first and second end wedges located at opposite ends of the center wedge and having surfaces that abut against the sloped surfaces of the center wedge;
    a screw interconnecting the first and second end wedges, wherein the remote end of the screw, opposite the screw's head, threadedly engages a threaded bore in the first end wedge and projects beyond the first end wedge, and wherein rotation of the screw in a first direction draws the two end wedges toward each other such that the end wedges and interconnecting screw are deflected transversely by the sloped surfaces of the center wedge, to lock the printed circuit board within the elongated slot in the rack;
    a friction nut threaded onto the portion of the remote end of the screw projecting beyond the first end wedge;
    two flat, abutting low-friction spacers encircling the remote end of the screw, between the friction nut and the first end wedge;
    wherein the friction nut and two spacers prevent the screw from being inadvertently unthreaded fully from the first end wedge.

2. A locking wedge apparatus as defined in claim 1, wherein the two spacers are made of a plastic material.

3. A locking wedge apparatus as defined in claim 2, wherein the two spacers are made of polypropylene.

4. A locking wedge apparatus as defined in claim 1, wherein the coefficient of friction between the two spacers is substantially less than the coefficient of friction between the friction nut and the screw.

5. A locking wedge apparatus for locking a printed circuit board within an elongated slot in a rack, comprising:
    a center wedge having sloped surfaces at its opposite ends;
    first and second end wedges located at opposite ends of the center wedge and having surfaces that abut against the sloped surfaces of the center wedge;
    a screw interconnecting the first and second end wedges, wherein the remote end of the screw, opposite the screw's head, threadedly engages a threaded bore in the first end wedge and projects beyond the first end wedge, and wherein rotation of the screw in a first direction draws the two end wedges toward each other such that the end wedges and interconnecting screw are deflected transversely by the sloped surfaces of the center wedge, to lock the printed circuit board within the elongated slot in the rack;
    a friction nut threaded onto the portion of the remote end of the screw projecting beyond the first end wedge; and
    two flat, low-friction spacers encircling the remote end of the screw, between the friction nut and the first end wedge, wherein the facing surfaces of the spacers form low-friction abutting surfaces having a predetermined coefficient of friction between them that is sufficiently low that, when the screw is lossened, the frictional torque developed between the nut and the first end wedge is exceeded by the frictional torque developed between the nut and the screw, whereby an excessive unthreading of the screw from the first end wedge is prevented.

6. A locking wedge apparatus as defined in claim 5, wherein the two spacers are made of a plastic material.

7. A locking wedge apparatus as defined in claim 6, wherein the two spacers are made of polypropylene.

8. A locking wedge apparatus for locking a printed circuit board within an elongated slot in a rack, comprising:
    a center wedge having sloped surfaces at its opposite ends;
    first and second end wedges located at opposite ends of the center wedge ad having surfaces that abut against the sloped surfaces of the center wedge;
    a screw interconnecting the first and second end wedges, wherein the remote end of the screw, opposite the screw's head, threadedly engages a threaded bore in the first end wedge and projects beyond the first end wedge, wherein the screw head is adapted for engagement by means for rotatably driving the screw, and wherein rotation of the screw i a first direction draws the two end wedges toward each other such that the end wedges and interconnecting screw are deflected transversely by the sloped surfaces of the center wedge, to lock the printed circuit board within the elongated slot in the rack; and a friction nut threaded onto the portion of the remote end of the screw projecting beyond the first end wedge, the friction nut being spaced from the first end wedge when the two end wedges and the screw are defected transversely;

wherein the apparatus is configured to include a pair of low-friction abutting surfaces between the friction nut and the first end wedge, and wherein the abutting surfaces have a predetermined coefficient of friction between them that is sufficiently low that, when the screw is loosened, the frictional torque developed between the nut and the first end wedge is exceeded by the frictional torque developed between the nut and the screw, whereby an excessive unthreading of the screw from the first end wedge is prevented.

9. A locking wedge apparatus as defined in claim 8, and further including a low-friction, plastic coating on the facing surfaces of the friction nut and the first end wedge, wherein such facing surfaces form the low-friction abutting surfaces having the predetermined coefficient of friction.

* * * * *

UNITED STATES PATENT AND TRADEMARK OFFICE
CERTIFICATE OF CORRECTION

PATENT NO. : 4,824,303
DATED : April 25, 1989
INVENTOR(S) : William A. Dinger

It is certified that error appears in the above-identified patent and that said Letters Patent is hereby corrected as shown below:

In column 1, line 14, change "elongted" to --elongated--.

In column 1, line 32, after "a means for" insert --preventing the screw from unthreading excessively from--.

In column 3, line 23, change "1" to --13--.

In column 3, line 28, after "end of the screw" insert --threadedly engages a threaded bore 25 formed in the--.

In column 4, line 8, change "There" to --The--.

In column 6, line 61, change "ad" to --and--.

In column 7, line 2, change "i" to --in--.

Signed and Sealed this

Thirtieth Day of January, 1990

*Attest:*

JEFFREY M. SAMUELS

*Attesting Officer*   *Acting Commissioner of Patents and Trademarks*